US010872967B2

(12) United States Patent
Shih et al.

(10) Patent No.: US 10,872,967 B2
(45) Date of Patent: Dec. 22, 2020

(54) MANUFACTURING METHOD OF SEMICONDUCTOR DEVICE

(71) Applicant: GLC SEMICONDUCTOR GROUP (CQ) CO., LTD., Chongqing (CN)

(72) Inventors: Yi-Chun Shih, Nantou County (TW); Shun-Min Yeh, Hsinchu (TW)

(73) Assignee: GLC SEMICONDUCTOR GROUP (CQ) CO., LTD., Chongqing (CN)

( * ) Notice: Subject to any disclaimer, the term of this patent is extended or adjusted under 35 U.S.C. 154(b) by 0 days.

(21) Appl. No.: 16/521,572

(22) Filed: Jul. 24, 2019

(65) Prior Publication Data
US 2020/0373407 A1    Nov. 26, 2020

(30) Foreign Application Priority Data

May 24, 2019 (TW) .............................. 108118022 A

(51) Int. Cl.
| H01L 21/00 | (2006.01) |
| H01L 29/00 | (2006.01) |
| H01L 29/66 | (2006.01) |
| H01L 21/308 | (2006.01) |
| H01L 29/40 | (2006.01) |
| H01L 21/762 | (2006.01) |
| H01L 29/423 | (2006.01) |
| H01L 29/417 | (2006.01) |

(52) U.S. Cl.
CPC ...... H01L 29/66462 (2013.01); H01L 21/308 (2013.01); H01L 21/76224 (2013.01); H01L 29/401 (2013.01); H01L 29/402 (2013.01); H01L 29/41741 (2013.01); H01L 29/4236 (2013.01)

(58) Field of Classification Search
CPC ............. H01L 21/308; H01L 21/76224; H01L 21/0217; H01L 21/02274; H01L 21/0254; H01L 21/02458; H01L 29/66462; H01L 29/401; H01L 29/402; H01L 29/41741; H01L 29/4236
See application file for complete search history.

(56) References Cited

U.S. PATENT DOCUMENTS

| 8,846,479 B2 * | 9/2014 | Kanamura | ............. H01L 29/205 257/411 |
| 8,912,571 B2 * | 12/2014 | Kanamura | ........ H01L 29/66462 257/194 |
| 9,960,264 B1 * | 5/2018 | Chen | .................. H01L 29/7786 |

(Continued)

FOREIGN PATENT DOCUMENTS

CN          105374678 A          3/2016

*Primary Examiner* — Nikolay K Yushin
(74) *Attorney, Agent, or Firm* — Winston Hsu

(57) ABSTRACT

A manufacturing method of a semiconductor device includes the following steps. At least one mesa structure is provided. The mesa structure includes a III-V compound semiconductor layer. A passivation layer is formed on the mesa structure. A gate dielectric layer is formed on the passivation layer, and a gate electrode is formed on the gate dielectric layer. An etching process is performed to the gate dielectric layer for thinning the gate dielectric layer before the step of forming the gate electrode. The thickness of the gate dielectric layer may be modified by the etching process, and the electrical performance of the semiconductor device may be enhanced accordingly.

19 Claims, 12 Drawing Sheets

(56) References Cited

U.S. PATENT DOCUMENTS

| | | | |
|---|---|---|---|
| 10,374,053 B2* | 8/2019 | Kato | H01L 29/4236 |
| 2005/0127417 A1 | 6/2005 | Saenger | |
| 2012/0138944 A1* | 6/2012 | Kanamura | H01L 29/513 |
| | | | 257/66 |
| 2013/0256686 A1* | 10/2013 | Kanamura | H01L 21/02521 |
| | | | 257/76 |
| 2014/0239309 A1 | 8/2014 | Ramdani | |
| 2017/0317183 A1* | 11/2017 | Kato | H01L 21/28264 |

* cited by examiner

MANUFACTURING METHOD OF SEMICONDUCTOR DEVICE

BACKGROUND OF THE INVENTION

1. Field of the Invention

The present invention relates to a manufacturing method of a semiconductor device, and more particularly, to a manufacturing method of a semiconductor device including thinning a gate dielectric layer by an etching process.

2. Description of the Prior Art

Because of the semiconductor characteristics, III-V semiconductor compounds may be applied in many kinds of integrated circuit devices, such as high power field effect transistors, high frequency transistors, or high electron mobility transistors (HEMTs). In recent years, gallium nitride (GaN) based materials have been applied in the high power and high frequency products because of the properties of wider band-gap and high saturation velocity. Two-dimensional electron gas (2DEG) may be generated by the piezoelectricity property of the GaN-based materials, and the switching velocity may be enhanced because of the higher electron velocity and the higher electron density of the 2DEG. However, the electrical performance of the semiconductor device will be influenced by the condition of the interface between the GaN based material layers and the defect conduction between the gate dielectric layer and the GaN based material layer. Therefore, it is an important issue for the related field to solve the above-mentioned problems and improve the electrical performance by modifying the structural design and/or the process design.

SUMMARY OF THE INVENTION

It is one of the objectives of the present invention to provide a manufacturing method of a semiconductor device. An etching process is performed to a gate dielectric layer for thinning the gate dielectric layer before forming a gate electrode. The thickness of the gate dielectric layer may be modified and controlled for improving the electrically performance of the semiconductor device.

A manufacturing method of a semiconductor device is provided in an embodiment of the present invention. The manufacturing method includes the following steps. Firstly, at least one mesa structure is provided, and the mesa structure includes a III-V compound semiconductor layer. A passivation layer is formed on the mesa structure. A gate dielectric layer is formed on the passivation layer. A gate electrode is formed on the gate dielectric layer. An etching process is performed to the gate dielectric layer for thinning the gate dielectric layer before forming the gate electrode.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

FIGS. 10-12 are schematic drawings illustrating a manufacturing method of a semiconductor device according to a fourth embodiment of the present invention, wherein FIG. 11 is a schematic drawing in a step subsequent to FIG. 10, and FIG. 12 is a schematic drawing in a step subsequent to FIG. 11.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

Figure 1:
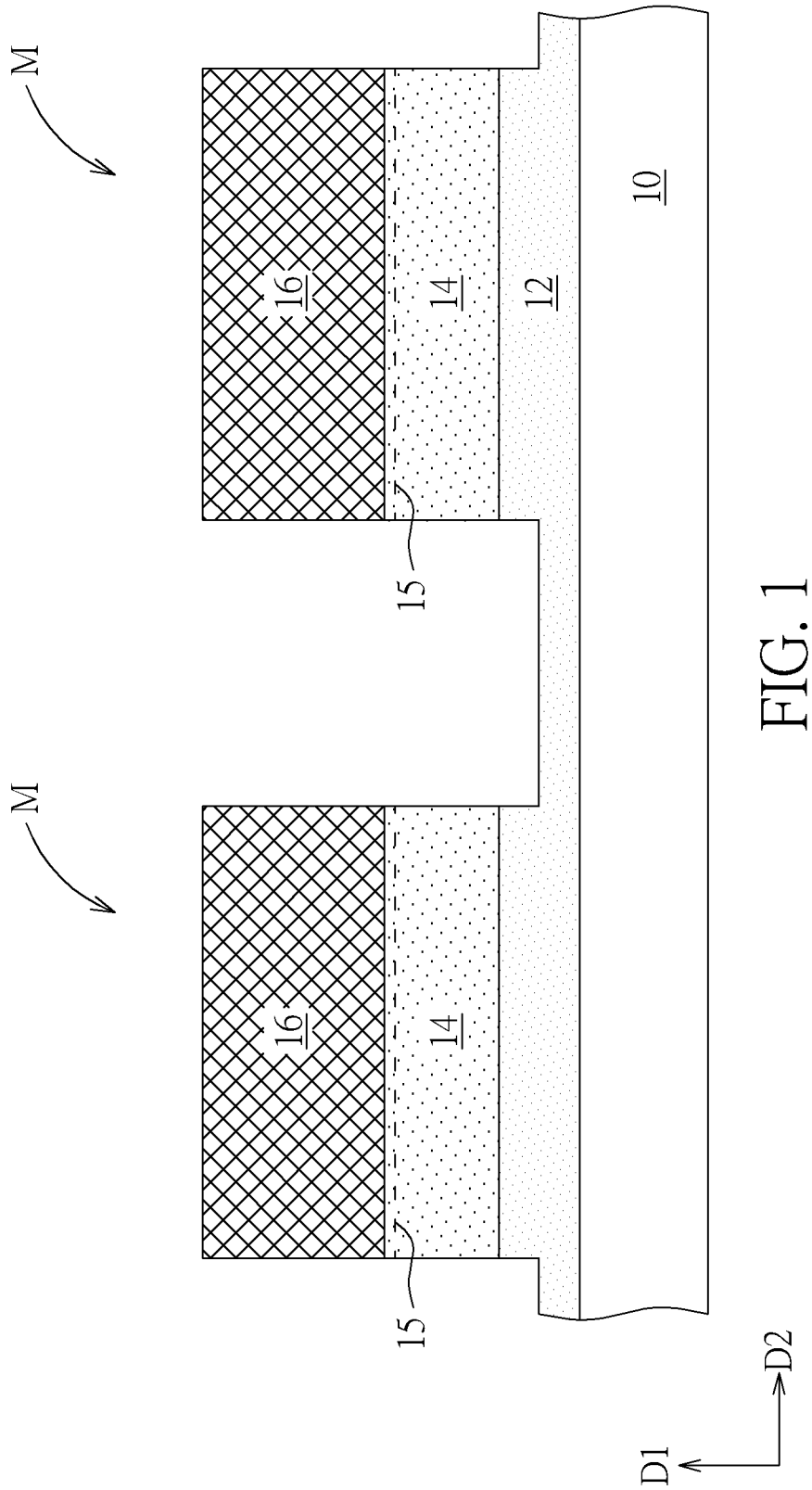
Figure 2:
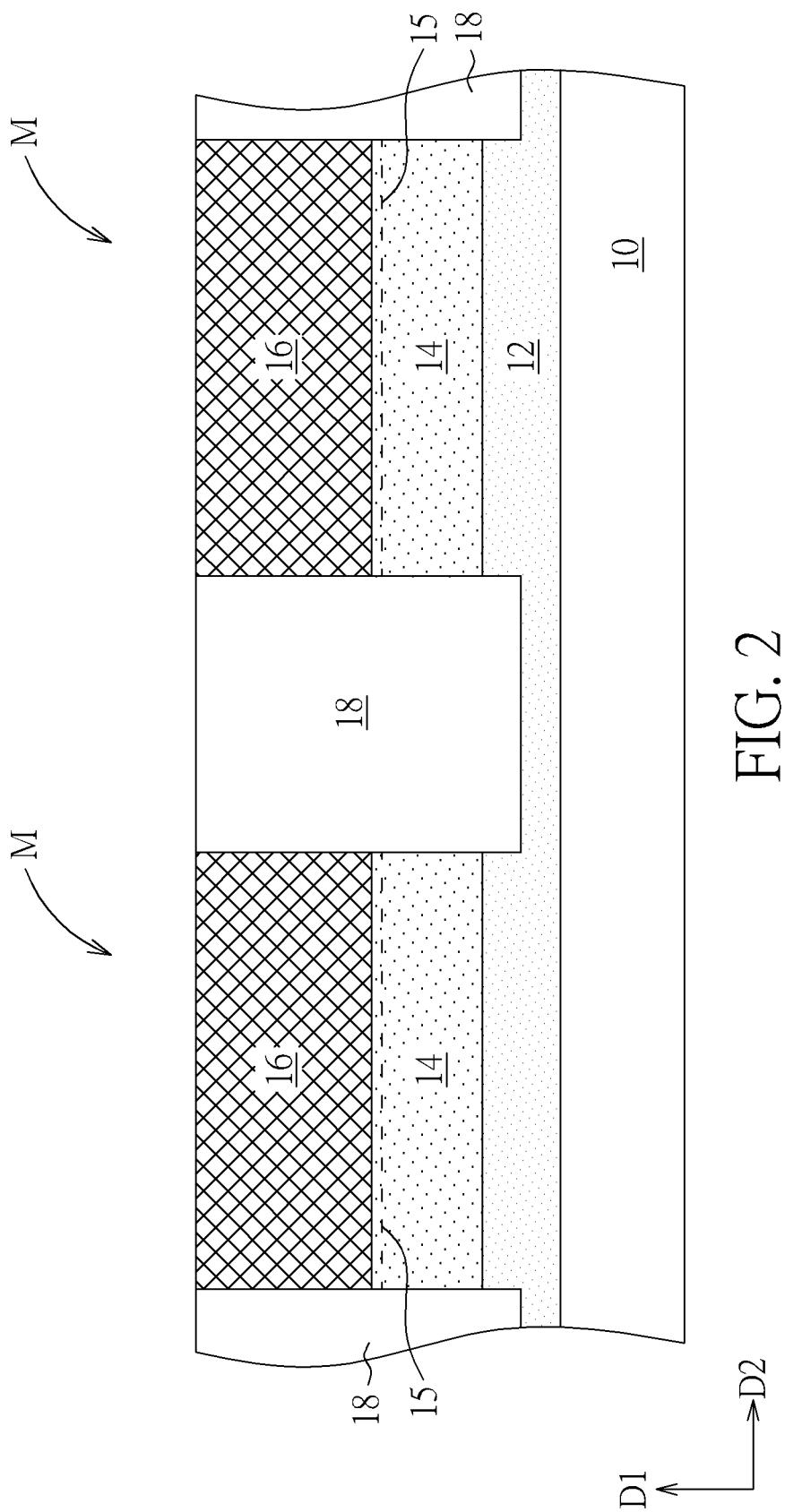
Figure 3:
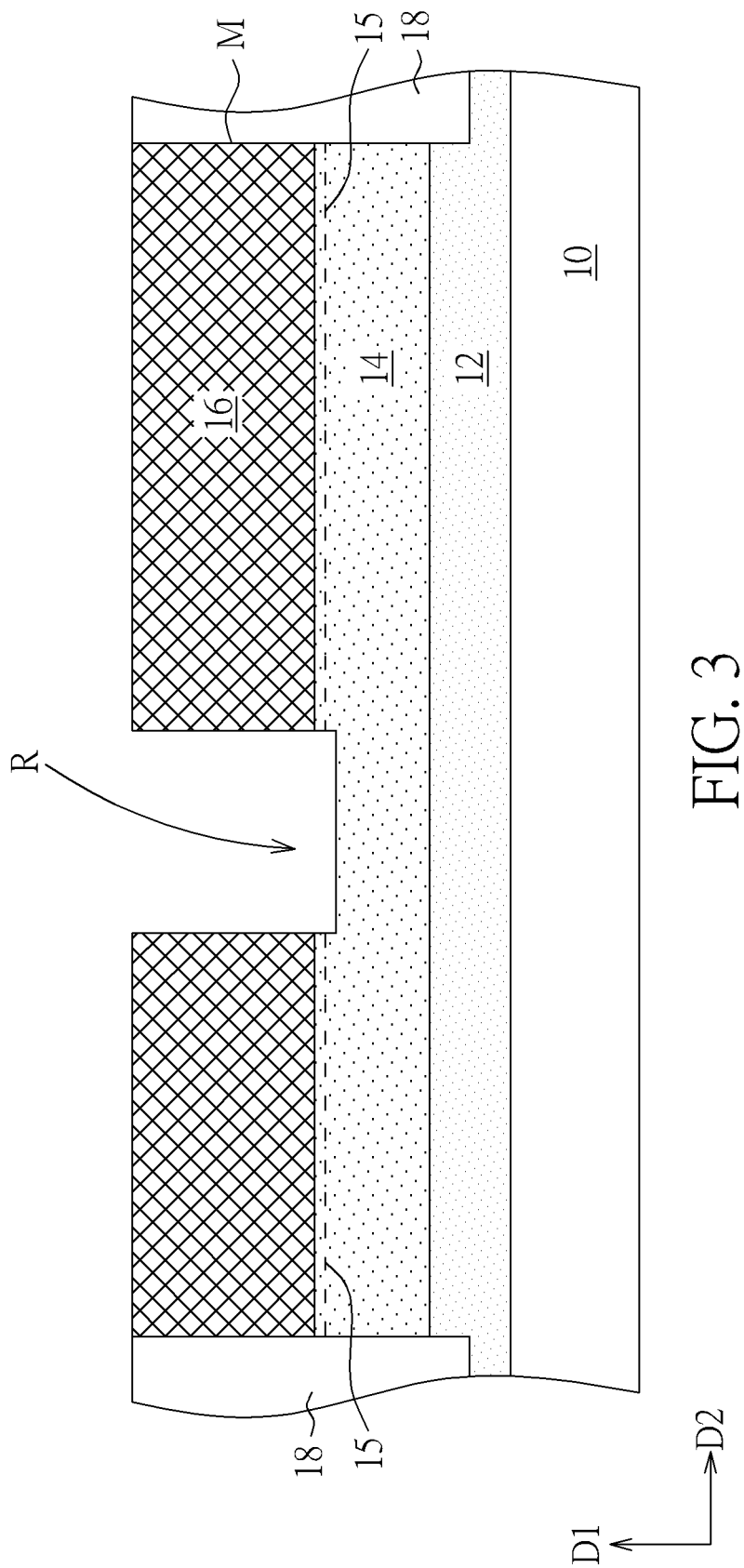
Figure 4:
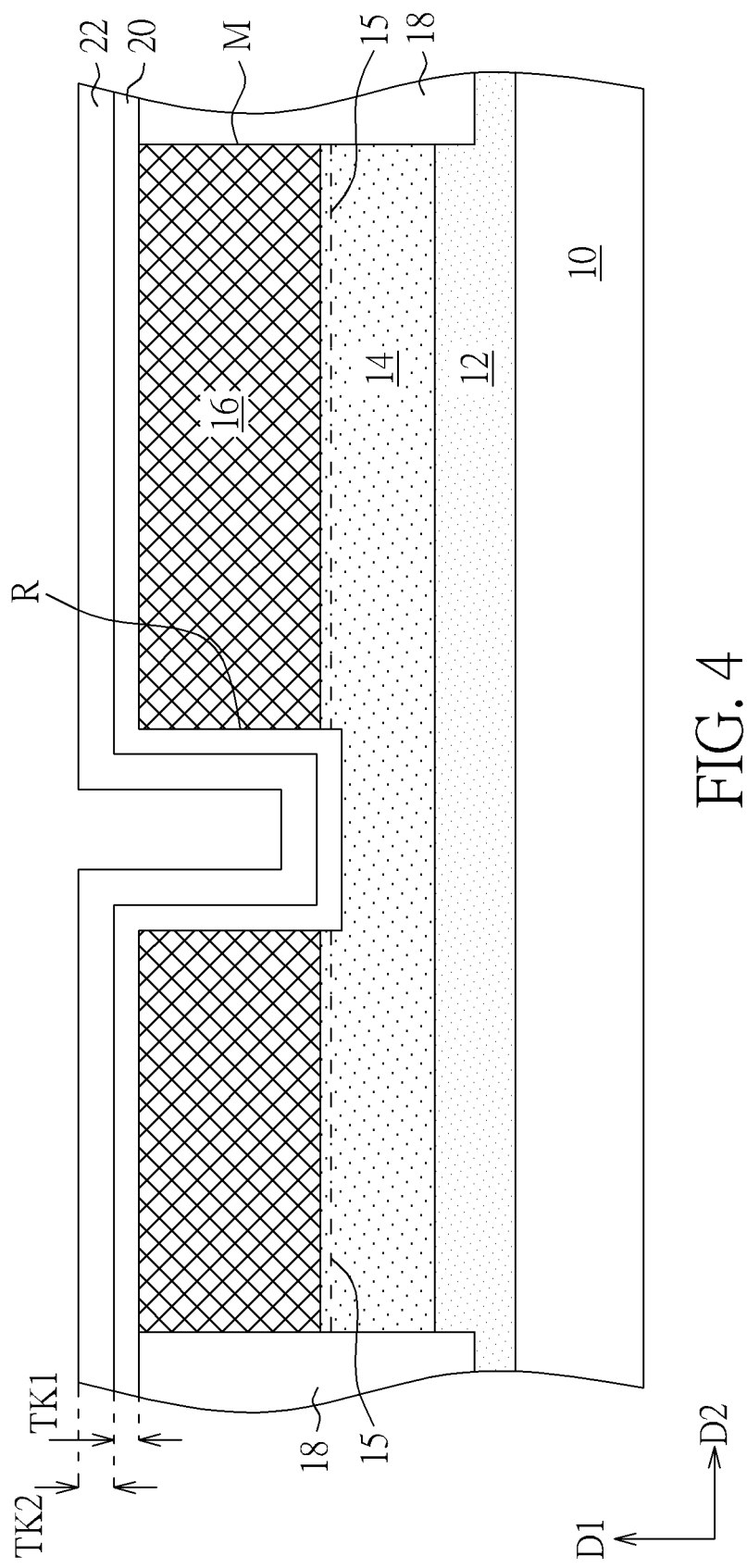
Figure 5:
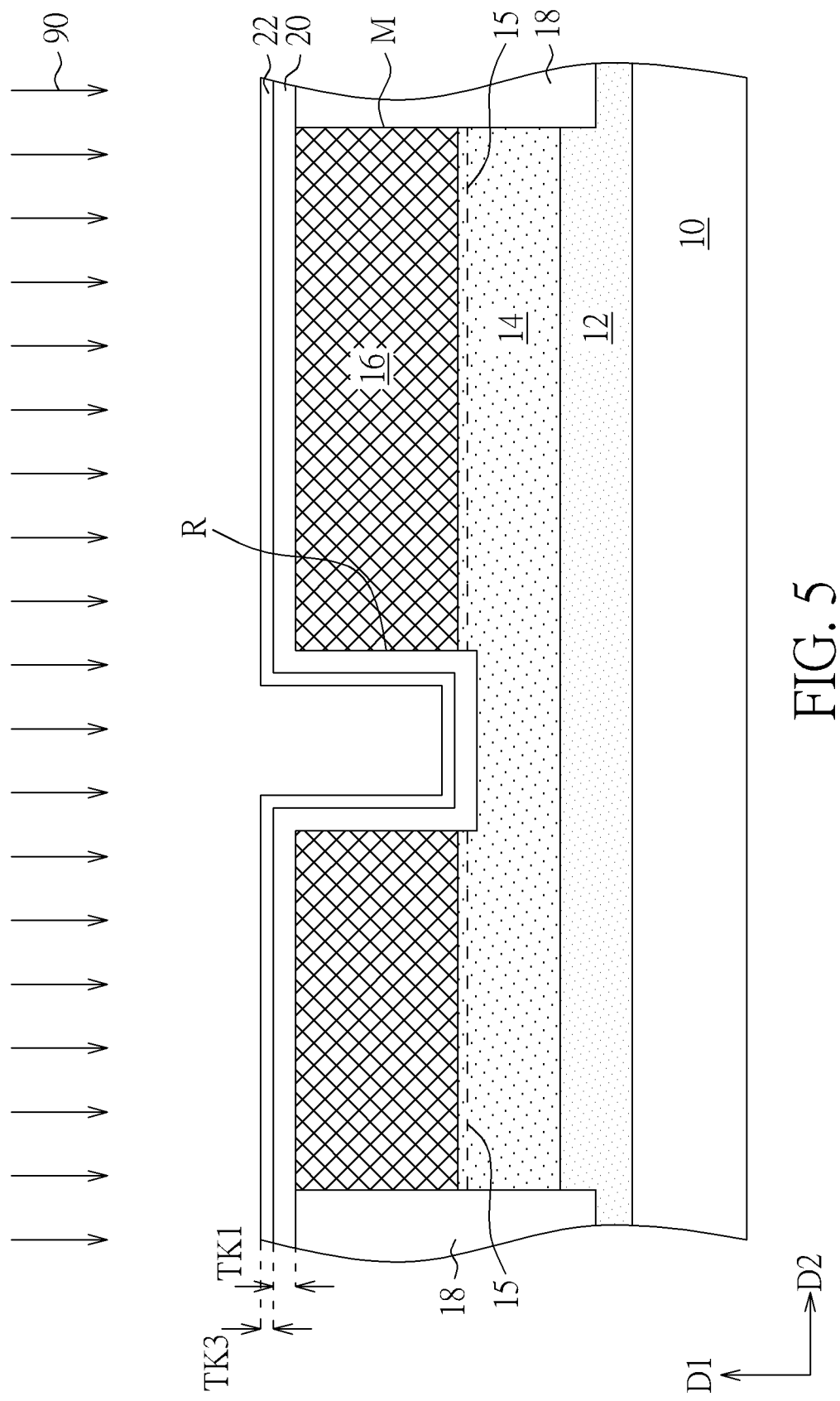
Figure 6:
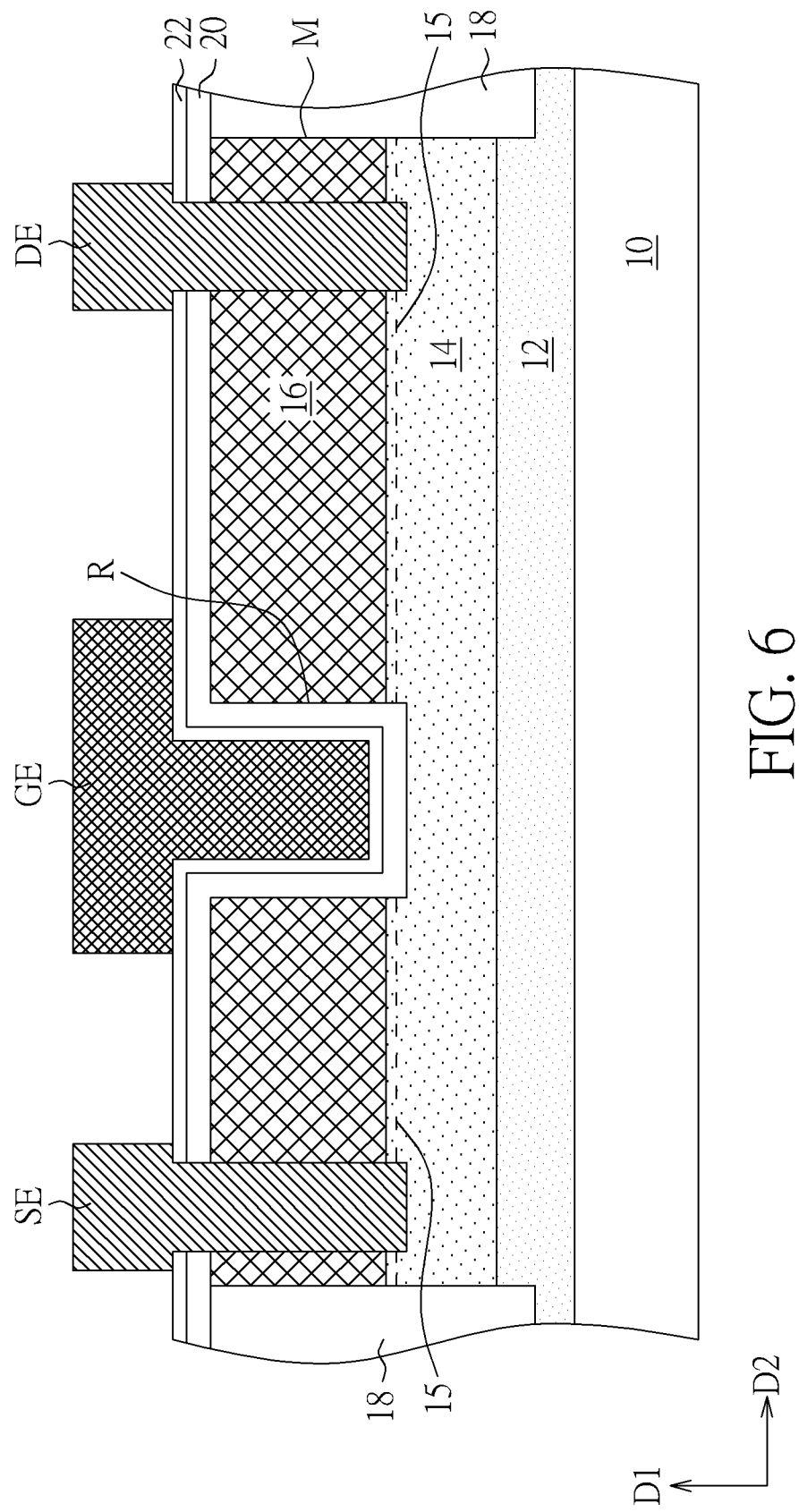
Figure 7:
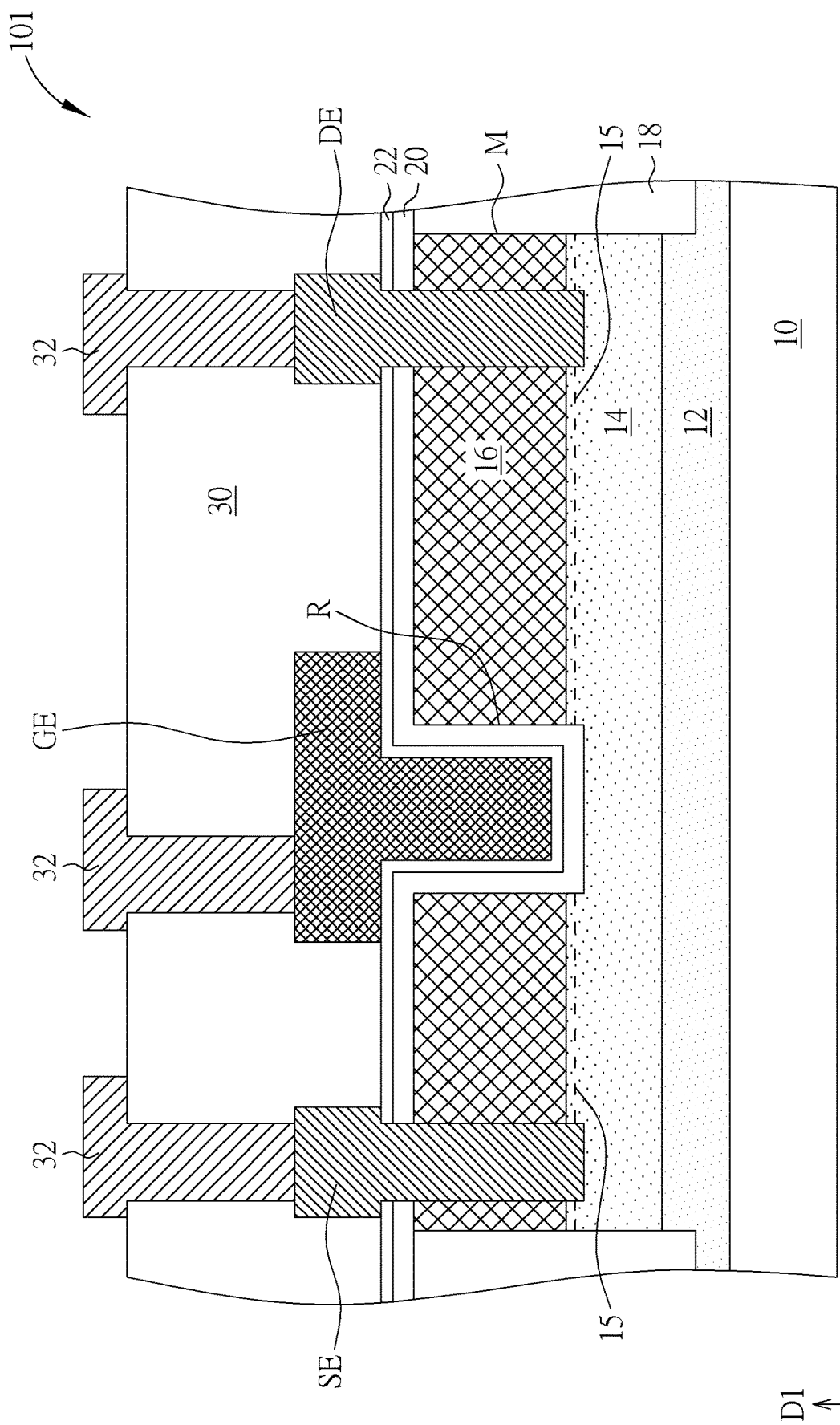

Please refer to FIGS. 1-7. FIGS. 1-7 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6. A manufacturing method of a semiconductor device is provided in this embodiment and includes the following steps. Firstly, as shown in FIG. 1, at least one mesa structure M is provided, and the mesa structure M includes a III-V compound semiconductor layer 14. In some embodiments, a buffer layer 12 may be formed on a substrate 10, the III-V compound semiconductor layer 14 may be formed on the buffer layer 12, and a nitride layer 16 may then be formed on the III-V compound semiconductor layer 14. In some embodiments, two-dimensional electron gas (2DEG) 15 may be localized in the III-V compound semiconductor layer 14 and at a side adjacent to the nitride layer 16 (such as a location of a dotted line shown in FIG. 1). Subsequently, the nitride layer 16, the III-V compound semiconductor layer 14, and the buffer layer 12 may be patterned by a photolithography process for forming the mesa structure M. Therefore, the mesa structure M may include the nitride layer 16, the III-V compound semiconductor layer 14, and a part of the buffer layer 12 disposed and stacked in a vertical direction (such as a first direction D1 shown in FIG. 1), and the nitride layer 16 in the mesa structure is disposed on the III-V compound semiconductor layer 14, but not limited thereto. In some embodiments, the mesa structure M may also be formed by other manufacturing approaches and/or other material compositions different from those described above according to other considerations. Additionally, in some embodiments, two or more mesa structures M may be formed by the manufacturing approach described above. The nitride layers 16 in the mesa structures M may be separated from one another, the III-V compound semiconductor layers 14 in the mesa structures M may be separated from one another, and the buffer layers 12 in the mesa structures M may be connected with one another, but not limited thereto.

In some embodiments, the substrate 10 described above may include a silicon substrate, a silicon carbide (SiC) substrate, a gallium nitride (GaN) substrate, a sapphire substrate, or a substrate formed by other appropriate materials, and the buffer layer 12 may include a buffer material beneficial for forming the III-V compound semiconductor layer 14 on the substrate 10 by an epitaxial growth approach. Therefore, the buffer layer 12 may include gallium nitride, aluminum gallium nitride (AlGaN), or other suitable buffer materials. However, the manufacturing method of the III-V compound semiconductor layer 14 in the mesa structure M is not limited to the condition described above. In some embodiments, the III-V compound semiconductor layer 14 in the mesa structure M may be formed by performing a patterning process to a III-V compound semiconductor substrate directly, and the substrate 10 and the buffer layer 12 described above may not be required in this situation. In addition, the III-V compound semiconductor layer 14 may be used as a channel layer in a semiconductor device, and gallium nitride, indium gallium nitride (InGaN), and/or other suitable III-V compound semiconductor materials may be used to form the III-V compound semiconductor layer 14. In some embodiments, the III-V compound semiconductor layer 14 may be a single layer or multiple layers of the III-V compound materials described above. For example, the III-V compound semiconductor layer 14 may be a single layer of gallium nitride, or the III-V compound semiconductor layer 14 may be a stacked structure including a gallium nitride layer and an aluminum gallium nitride layer. The aluminum gallium nitride layer in the III-V compound semiconductor layer 14 may be disposed between the gallium nitride layer and the buffer layer 12, the gallium nitride layer in the III-V compound semiconductor layer 14 may be used as a channel layer, and the aluminum gallium nitride layer in the III-V compound semiconductor layer 14 may be used as a barrier layer or a layer having other functions (such as providing an anti-polarizing effect), but not limited thereto. Additionally, the nitride layer 16 formed on the III-V compound semiconductor layer 14 may be used as a barrier layer or a capping layer in a semiconductor device. The nitride layer 16 may be formed by materials such as aluminum gallium nitride, aluminum indium nitride (AlInN), and/or aluminum nitride (AlN) when the nitride layer 16 is used as a barrier layer, and the nitride layer 16 may be formed by materials such as aluminum gallium nitride, aluminum nitride, gallium nitride, and/or silicon nitride when the nitride layer 16 is used as a capping layer, but not limited thereto. In addition, the nitride layer 16 may be a single layer or multiple layers of the III-nitride materials. For instance, the nitride layer 16 may be a single layer of aluminum gallium nitride, or the nitride layer 16 may be a stacked structure including aluminum gallium nitride layer and other III-nitride materials, such as a triple-layer structure including a gallium nitride layer, an aluminum gallium nitride layer, and an aluminum nitride layer. The aluminum gallium nitride layer in the nitride layer 16 may be located between the gallium nitride layer and the aluminum nitride layer, the aluminum nitride layer in the nitride layer 16 may be located between the aluminum gallium nitride layer and the III-V compound semiconductor layer 14. The main composition of the nitride layer 16 may be the aluminum gallium nitride layer, and the thickness of the aluminum gallium nitride layer may be greater than the thickness of the gallium nitride layer and the thickness of the aluminum nitride layer in the nitride layer 16 accordingly, but not limited thereto.

As shown in FIG. 1 and FIG. 2, in some embodiments, a plurality of the mesa structures M may be provided, and an isolation structure 18 may be formed between the mesa structures M for isolating the adjacent mesa structures M from each other. The isolation structure 18 may include a single layer or multiple layers of insulation materials, such as silicon oxide, silicon nitride, silicon oxynitride, or other suitable insulation materials. The isolation structure 18 may be formed by filling the space between the mesa structures M with the insulation materials described above and performing a suitable process (such as a planarization process and/or an etching back process) for removing the insulation material formed above the mesa structures M. Therefore, the isolation structure 18 may be located between the mesa structures M adjacent to each other in a horizontal direction (such as a second direction D2 parallel to the surface of the substrate 10 shown in FIG. 2), and the topmost surface of the isolation structure 18 in the first direction D1 and the topmost surface of the mesa structures M may be substantially coplanar, but not limited thereto.

Subsequently, as shown in FIG. 2 and FIG. 3, a recess R may be formed in at least one of the mesa structures M, a gate electrode may be subsequently formed in the recess R, and the recess R may be regarded as a gate recess, but not limited thereto. In some embodiments, a depth of the recess R in the first direction D1 may be greater than the thickness of the nitride layer 16 in the first direction D1, and the recess R may be partially formed in the nitride layer 16 and partially formed in the III-V compound semiconductor layer 14 accordingly, but the present invention is not limited to this. In some embodiments, the depth of the recess R in the first direction D1 may be less than or equal to the thickness of the nitride layer 16 in the first direction D1, and the recess R may be formed in the nitride layer 16 only without being formed in the III-V compound semiconductor layer 14. In some embodiments, the recess R may be formed by an inductively coupled plasma (ICP) etching process or other suitable etching processes, and suitable post-etching treatments (such as a cleaning treatment or an annealing treatment) may be applied to reduce etching defects formed by the step of forming the recess R.

Subsequently, as shown in FIG. 3 and FIG. 4, a passivation layer 20 is formed on the mesa structure M, and a gate dielectric layer 22 is formed on the passivation layer 20. In other words, the passivation layer 20 and the gate dielectric layer 22 may be formed after the step of forming the recess R, and the passivation layer 20 and the gate dielectric layer 22 may be partially formed in the recess R. In some embodiments, the passivation layer 20 may be formed by an atomic layer deposition (ALD) process or other suitable film-forming processes, the passivation layer 20 may be formed conformally on the mesa structure M and conformally in the recess R accordingly, and the gate dielectric layer 22 may be formed conformally on the passivation layer 20 substantially, but not limited thereto. In some embodiments, the passivation layer 20 may be a single-layer material (such as aluminum nitride formed by ALD or other suitable compound materials formed by ALD) or a multiple-layered material (such as two layers of aluminum nitride or other suitable compound materials and a dielectric material sandwiched between the two layers), and the gate dielectric layer 22 may include silicon nitride (such as $Si_3N_4$), silicon oxide (such as $SiO_2$), aluminum oxide (such as $Al_2O_3$), hafnium oxide (such as $HfO_2$), lanthanum oxide (such as $La_2O_3$), lutetium oxide (such as $Lu_2O_3$), lanthanum lutetium oxide (such as $LaLuO_3$), or other suitable dielectric materials, but not limited thereto. Additionally, in some embodiments, the passivation layer 20 and the gate dielectric layer 22 may be further formed on the isolation structure 18, and a thickness of the gate dielectric layer 22 (such as a second thickness TK2 shown in FIG. 4) may be greater than a thickness of the passivation layer 20 (such as a first thickness TK1 shown in FIG. 4), but not limited thereto.

As shown in FIG. 4 and FIG. 5, an etching process 90 may then be performed to the gate dielectric layer 22 for thinning the gate dielectric layer 22. In some embodiments, the thickness of the gate dielectric layer 22 (such as a third thickness TK3 shown in FIG. 5) may be less than the first thickness TK1 of the passivation layer 20 after the etching process 90, but not limited thereto. Additionally, the etching process 90 may include a dry etching process, a wet etching process (such as a wet etching process using dilute hydrofluoric acid), or other suitable etching processes for controlling and/or modifying the thickness of the gate dielectric layer 22.

As shown in FIG. 5 and FIG. 6, a gate electrode GE, a source electrode SE, and a drain electrode DE may be formed after the etching process 90. The gate electrode GE may be formed on the gate dielectric layer 22, and the gate electrode GE may be partially formed in the recess R. In other words, the etching process 90 performed to the gate dielectric layer 22 may be performed before the step of forming the gate electrode GE for thinning the gate dielectric layer 22 before forming the gate electrode GE. In addition, the source electrode SE and the drain electrode DE may be formed at two opposite sides of the gate electrode GE in a horizontal direction (such as the second direction D2) respectively, and the source electrode SE and the drain electrode DE may be partially formed in the mesa structure M respectively, but not limited thereto. In some embodiments, the source electrode SE and the drain electrode DE may be formed by forming trenches located corresponding to the source electrode SE and the drain electrode DE in the mesa structure M, forming a suitable conductive material in the trenches, and performing a patterning process to the conductive material. Therefore, the source electrode SE and the drain electrode DE may penetrate the gate dielectric layer 22 and the passivation layer 20 on the at least one mesa structure M, and the source electrode SE and the drain electrode DE may be partially formed in the mesa structure M and partially formed on the gate dielectric layer 22. In some embodiments, the depth of the trenches described above may be greater than the thickness of the nitride layer 16 in the first direction D1, the source electrode SE may be partially formed in the nitride layer 16 and partially formed in the III-V compound semiconductor layer 14, and the drain electrode DE may be partially formed in the nitride layer 16 and partially formed in the III-V compound semiconductor layer 14 accordingly, but the present invention is not limited to this. In some embodiments, the depth of the trenches described above may be less than or equal to the thickness of the nitride layer 16 in the first direction D1, and the source electrode SE and the drain electrode DE may be formed in the nitride layer 16 respectively without being formed in the III-V compound semiconductor layer 14. In some embodiments, the trenches described above may be formed by an ICP etching process or other suitable etching process, and suitable post-etching treatments (such as a cleaning treatment or an annealing treatment) may be applied to reduce related etching defects.

In some embodiments, the gate electrode GE, the source electrode SE, and the drain electrode DE may be formed by different steps according to some considerations. For example, a suitable conductive material may be formed on the mesa structure M and formed in the recess R, and the conductive material may then be patterned to be the gate electrode GE. The trenches located corresponding to the source electrode SE and the drain electrode DE described above, the source electrode SE, and the drain electrode DE may be formed after the step of forming the gate electrode GE. However, in some embodiments, the source electrode SE and the drain electrode DE may be formed firstly, and the gate electrode GE may be formed after the step of forming the source electrode SE and the drain electrode DE, or the gate electrode GE, the source electrode SE, and the drain electrode DE may be formed concurrently by the same material and the same manufacturing process. In some embodiments, the gate electrode GE, the source electrode SE, and the drain electrode DE may respectively include conductive metal materials or other suitable conductive materials. The conductive metal materials mentioned above may include gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above-mentioned materials, a stack layer of the above-mentioned materials, or an alloy of the above-mentioned materials, but not limited thereto.

As shown in FIG. 6 and FIG. 7, an interlayer dielectric layer 30 may be formed covering the gate electrode GE, the source electrode SE, and the drain electrode DE, contact structures 32 may be formed corresponding to the gate electrode GE, the source electrode SE, and the drain electrode DE respectively, and a semiconductor device 101 shown in FIG. 7 may be formed accordingly. The interlayer dielectric layer 30 may include a single layer or multiple layers of dielectric materials, such as silicon oxide, silicon nitride, silicon oxynitride, or other suitable dielectric materials, and the contact structures 32 may include a conductive material having relatively lower resistivity (such as copper, aluminum, and tungsten) and a barrier layer (such as titanium nitride, tantalum nitride, or other suitable barrier materials) located between the conductive material mentioned above and the interlayer dielectric layer 30, but not limited thereto. By the manufacturing method of this embodiment, the etching process may be performed to the gate dielectric layer 22 for thinning the gate dielectric layer 22 before the step of forming the gate electrode GE, the thickness of the gate dielectric layer 22 may be controlled and modified, and the electrical performance of the semiconductor device 101 may be enhanced accordingly. For example, the gate leakage current may be reduced accordingly, but not limited thereto. The threshold voltage (Vth) of the semiconductor device 101 may be modified by forming the recess R in the mesa structure M and forming at least a part of the gate electrode GE in the recess R. For example, the threshold voltage may be higher than zero voltage accordingly, and the semiconductor device 101 under this condition may be regarded as an enhancement mode (E-mode) high electron mobility transistor (HEMT), but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
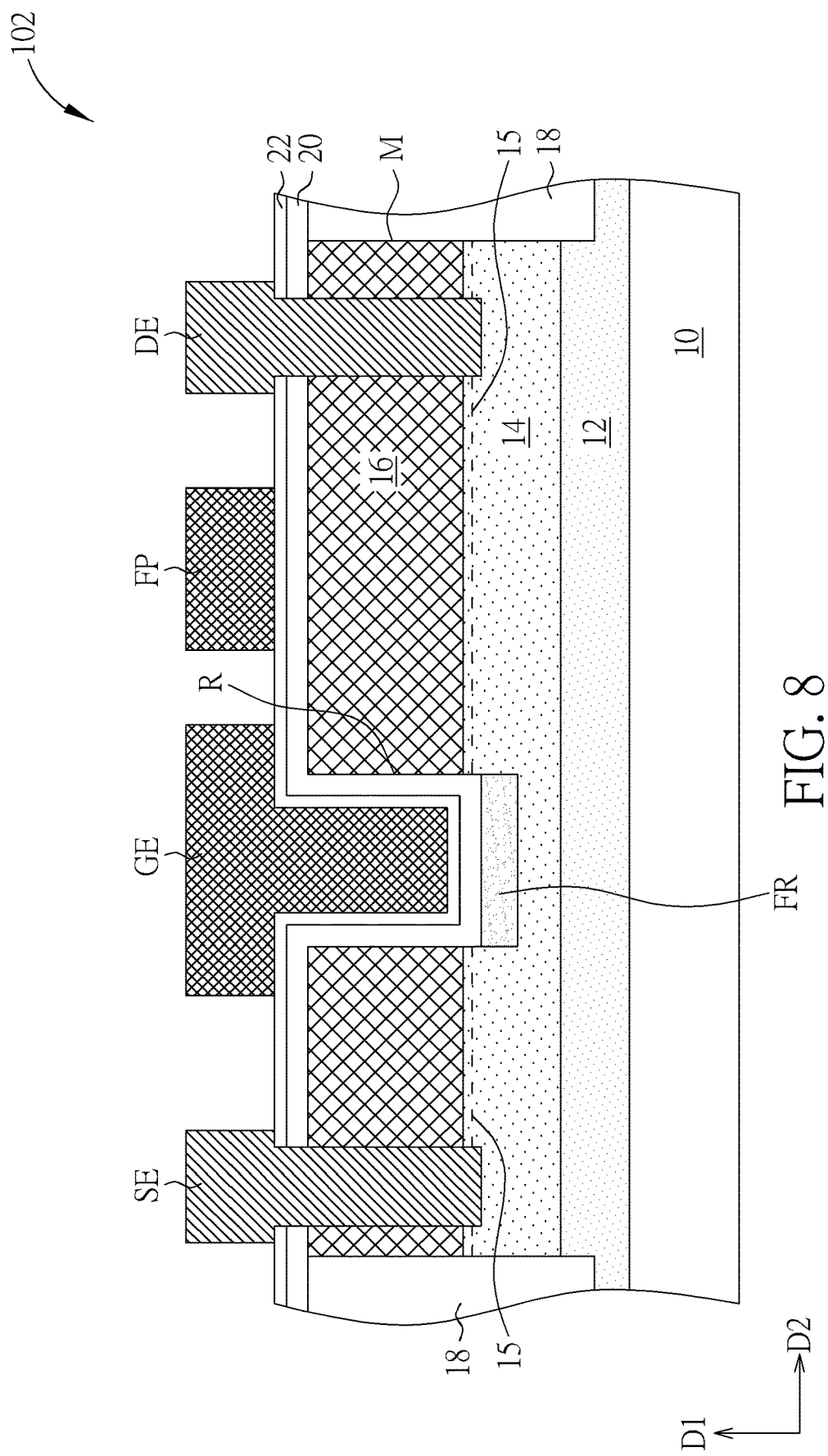
FIG. 8 is a schematic drawing illustrating a semiconductor device according to a second embodiment of the present invention.

Please refer to FIG. 8. FIG. 8 is a schematic drawing illustrating a semiconductor device 102 according to a second embodiment of the present invention. As shown in FIG. 8, the difference between the semiconductor device 102 and the semiconductor device of the first embodiment described above is that the semiconductor device 102 may further include a fluorine doped region FR and an auxiliary electrode FP. The fluorine doped region FR may be disposed in the mesa structure M under the recess R, and the auxiliary electrode FP may be disposed on the mesa structure M between the gate electrode GE and the drain electrode DE. In other words, the manufacturing method of the semiconductor device 102 may include forming the fluorine doped region FR in the mesa structure M under the recess R and forming the auxiliary electrode FP on the mesa structure M between the gate electrode GE and the drain electrode DE. The fluorine doped region FR may include fluorine ions therein, and the fluorine ions may provide static negative charge for effective depleting electrons of the carrier channel. The carrier concentration may become lowered or the channel may be interrupt, the carrier channel may become normally-off, the threshold voltage of the semiconductor device 102 may be modified, and the semiconductor device 102 may be a normally-off transistor accordingly, but not limited thereto. The dimension and the depth of the fluorine doped region FR may be controlled by modifying the process parameters of the process for forming the fluorine doped region FR, such as an ion implantation. For example, at least a part of the fluorine doped region FR may be located in the III-V compound semiconductor layer 14, or the fluorine doped region FR may be partially located in the nitride layer 16 or completely located in the nitride layer 16 when the depth of the recess R is less than the thickness of the nitride layer 16. Additionally, the auxiliary electrode FP may be electrically connected with the source electrode SE or the auxiliary electrode FP may be electrically floating according to some considerations, and the auxiliary electrode FP may be regarded as a field plate configured to alter the channel carrier density between the recess R and the drain electrode DE for modifying the breakdown voltage of the semiconductor device 102, but not limited thereto. In some embodiments, the auxiliary electrode FP and the gate electrode GE may be formed concurrently by the same material and the same process, but not limited thereto. In some embodiments, the auxiliary electrode FP and the source electrode SE may be formed concurrently by the same material and the same process according to some considerations, or the auxiliary electrode FP may be formed by a process different from the processes of forming the gate electrode GE, the source electrode SE, and the drain electrode DE. Additionally, it is worth noting that the fluorine doped region FR and/or the auxiliary electrode FP in this embodiment may also be applied in other embodiments of the present invention.

Figure 9:
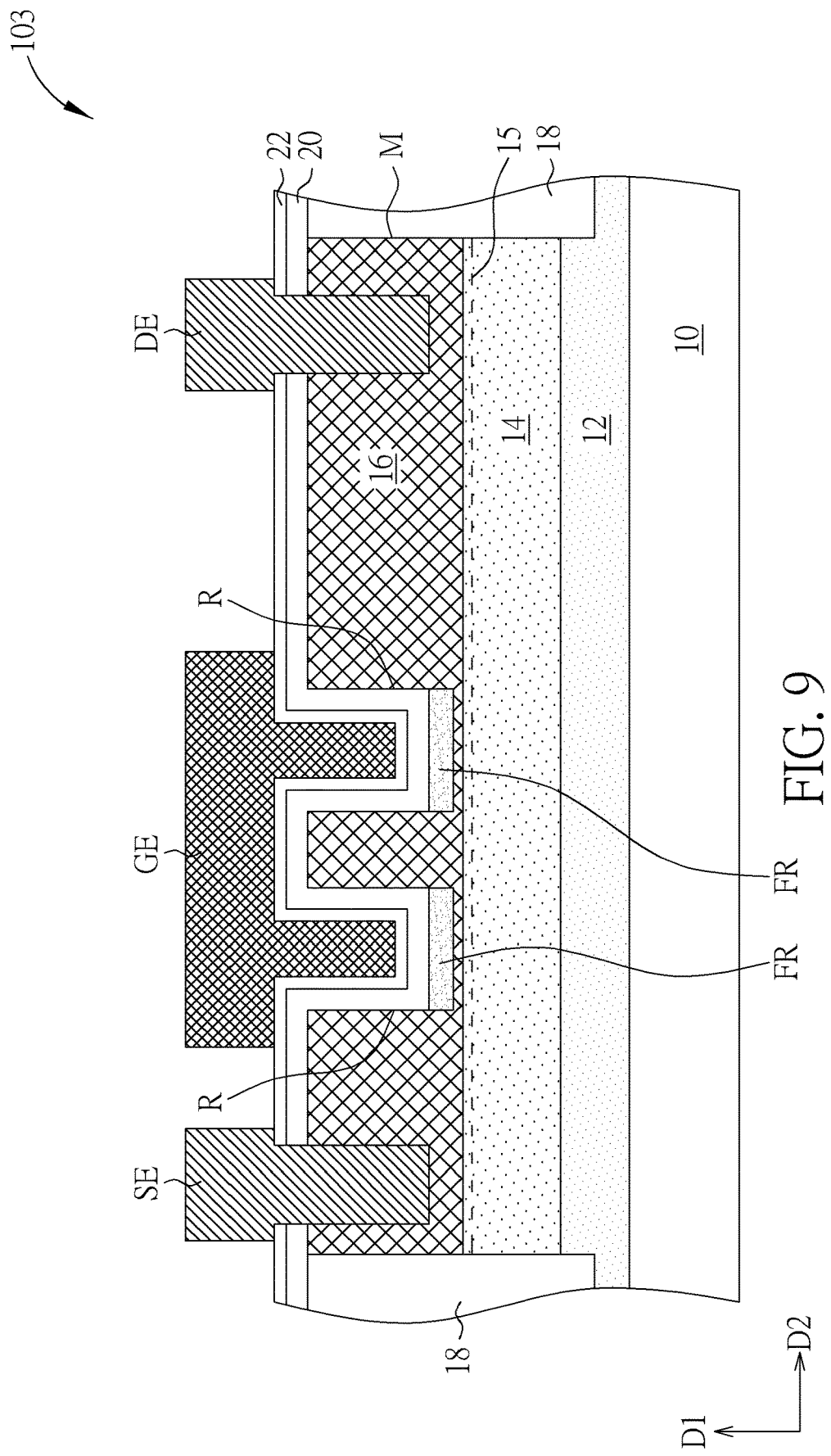
FIG. 9 is a schematic drawing illustrating a semiconductor device according to a third embodiment of the present invention.

Please refer to FIG. 9. FIG. 9 is a schematic drawing illustrating a semiconductor device 103 according to a third embodiment of the present invention. As shown in FIG. 9, the difference between the semiconductor device 103 and the semiconductor device of the first embodiment described above is that the semiconductor device 103 may further include a plurality of recesses R located in the mesa structure M, and at least a part of the gate electrode GE may be formed in the recesses R. Additionally, the semiconductor device 103 may include two or more fluorine doped regions FR disposed in the mesa structure M under the recesses R respectively. In other words, the manufacturing method of the semiconductor device 103 may include forming a plurality of the recesses R in the mesa structure M, and at least a part of the gate electrode GE may be formed in the recesses R. In addition, another part of the gate electrode GE may be disposed outside the recesses R. For instance, a part of the gate electrode GE may be disposed on the gate dielectric layer 22 outside the recesses R, and the parts of the gate electrode disposed in the recesses R may be regarded as being electrically connected with one another in parallel, but not limited thereto. In some embodiments, the depth of each of the recess R in the first direction D1 may be less than the thickness of the nitride layer 16 in the first direction D1, and the fluorine doped regions FR may be completely located in the nitride layer 16, or each of the fluorine doped regions FR may be partially located in the nitride layer 16 and partially located in the III-V compound semiconductor layer 14. In addition, the depth of the trenches located corresponding to the source electrode SE and the drain electrode DE and located in the mesa structure M may be less than the thickness of the nitride layer 16 in the first direction D1, and the source electrode SE and the drain electrode may be formed in the nitride layer 16 respectively without being formed in the III-V compound semiconductor layer 14.

Figure 10:
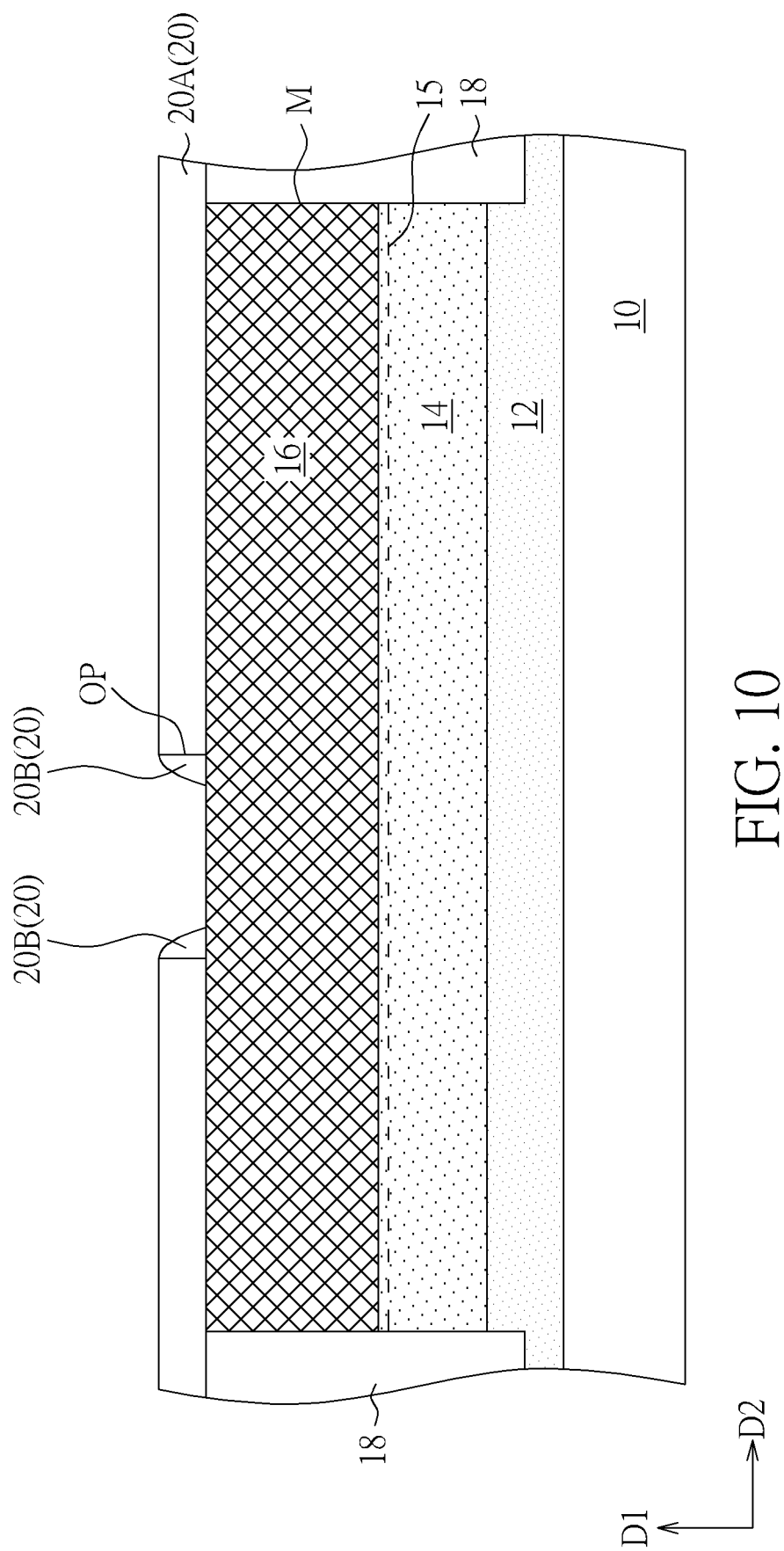
Figure 11:
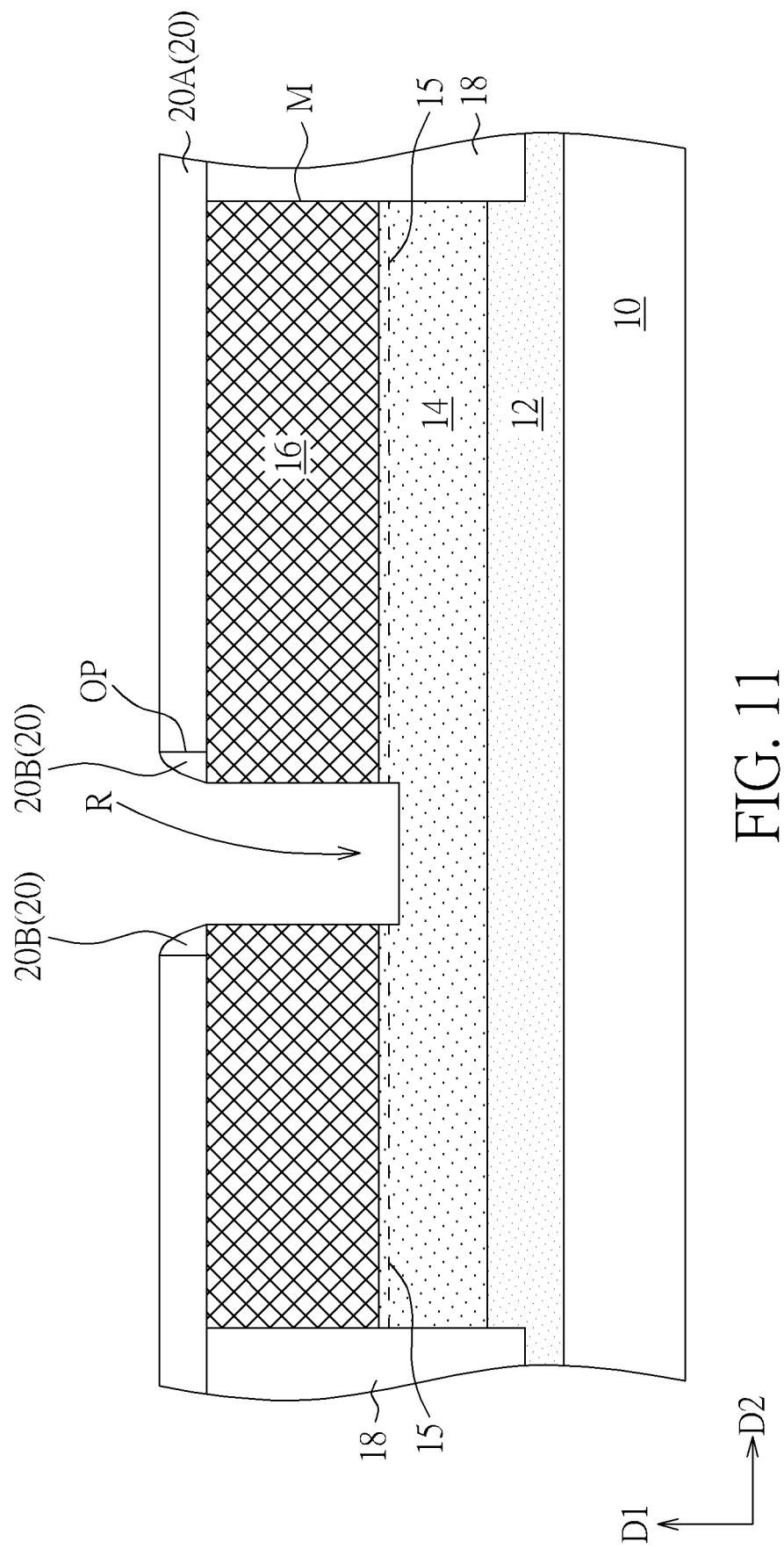
Figure 12:
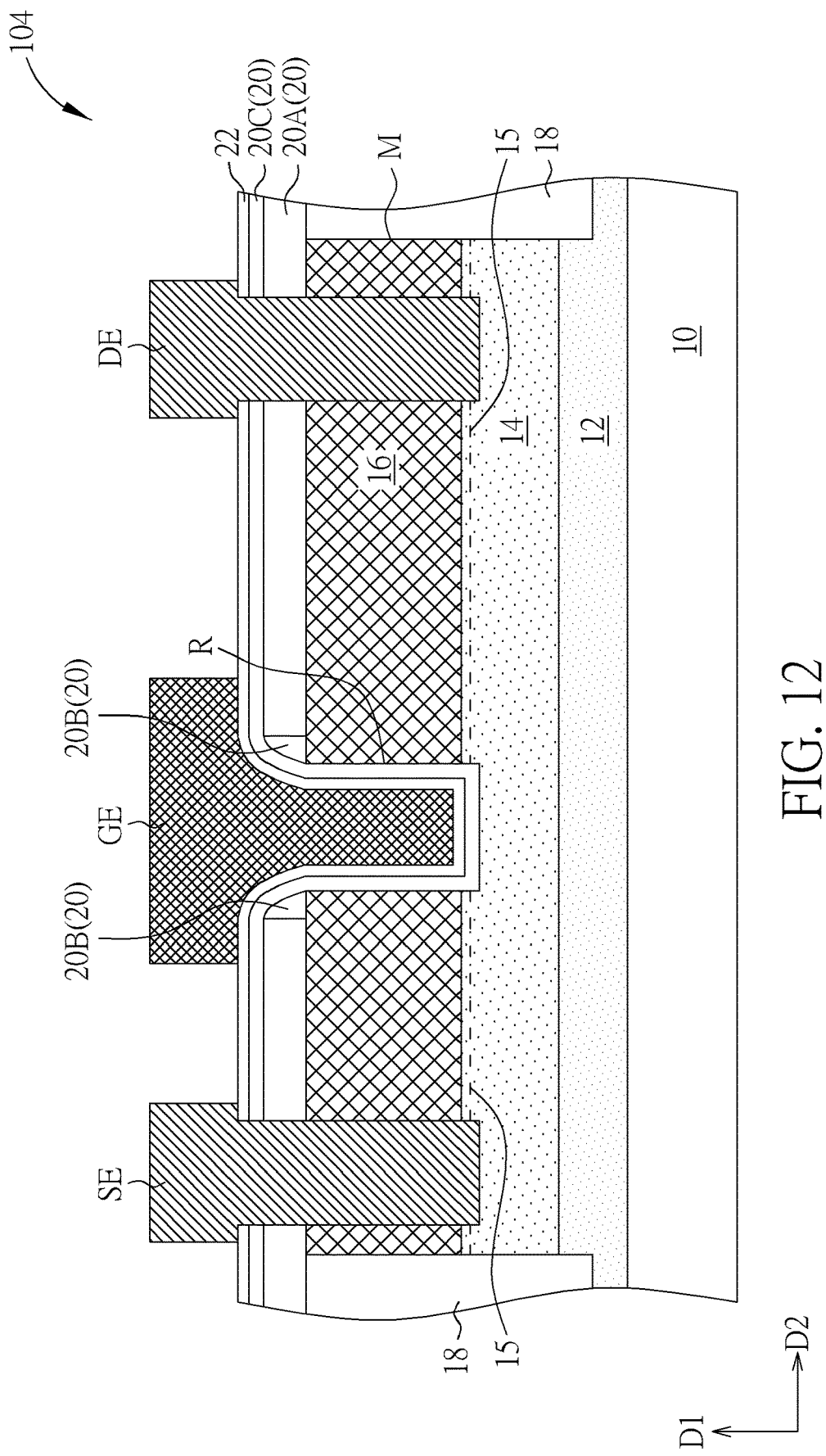

Please refer to FIGS. 10-12. FIGS. 10-12 are schematic drawings illustrating a manufacturing method of a semiconductor device 104 according to a fourth embodiment of the present invention, wherein FIG. 11 is a schematic drawing in a step subsequent to FIG. 10, and FIG. 12 is a schematic drawing in a step subsequent to FIG. 11. As shown in FIG. 10, in the manufacturing method of this embodiment, a first passivation layer 20A may be formed on the mesa structure M, and the first passivation layer 20A may be regarded as a part of the passivation layer 20 described above. Subsequently, an opening OP may be formed in the first passivation layer 20A, and the opening OP may expose the nitride layer 16 underneath the first passivation layer 20A. A spacer 20B may then be formed on a sidewall of the opening OP. The forming approach of the spacer 20B may include but is not limited to forming a spacer material layer on the first passivation layer 20A and in the opening OP and performing an etching back process to the spacer material layer for forming the spacer 20B and partially exposing the nitride layer 16. Subsequently, as shown in FIG. 10 and FIG. 11, the mesa structure M is etched with the spacer 20B as a mask for forming the recess R. In some embodiments, the spacer 20B and the first passivation layer 20A may be used as a mask in an etching process for forming the recess R, or other patterned mask (not shown) may be formed covering the first passivation layer 20A, and the patterned mask and the spacer 20B may be used as the etching mask. The recess R may be formed by a self-aligned approach accordingly, and that will be beneficial for controlling the dimension and/or the location of the recess R. As shown in FIG. 11 and FIG. 12, a second passivation layer 20C may be formed subsequently, and the second passivation layer 20C may be partially formed in the recess R and partially formed on the spacer 20B and the first passivation layer 20A. The gate dielectric layer 22, the gate electrode GE, the source electrode SE, and the drain electrode DE may be formed after the step of forming the second passivation layer 20C. In some embodiments, the first passivation layer 20A, the spacer 20B, and the second passivation layer 20C may be regarded as parts of the passivation layer 20 described above. Therefore, the passivation layer 20 may include the first passivation layer 20A, the spacer 20B, and the second passivation layer 20C. The first passivation layer 20A and the second passivation layer 20C may include aluminum nitride formed by an ALD approach or other suitable compound materials formed by an ALD approach, and the spacer 20B may include a dielectric material, but not limited thereto. In some embodiments, the etching process performed to the gate dielectric layer 22 for thinning the gate dielectric layer 22 may be performed before the steps of forming the gate electrode GE, the source electrode SE, and the drain electrode DE. Additionally, in some embodiments, the second passivation layer 22 may be used as a gate dielectric layer without forming the gate dielectric layer 22, and the etching process described above may be performed to the second passivation layer 20C before the steps of forming the gate electrode GE, the source electrode SE, and the drain electrode DE for thinning the second passivation layer 20C.

To summarize the above descriptions, according to the manufacturing method of the semiconductor device in the present invention, the etching process may be performed to the gate dielectric layer for thinning the gate dielectric layer before forming the gate electrode. The thickness of the gate dielectric layer may be modified and controlled for enhancing the electrical performance of the semiconductor device. For example, the gate leakage current may be reduced accordingly. In addition, the threshold voltage and/or the breakdown voltage of the semiconductor device may be modified by forming the recess in the mesa structure, forming at least a part of the gate electrode in the recess, forming the fluorine doped region in the mesa structure under the recess, and/or forming the auxiliary electrode on the mesa structure between the gate electrode and the drain electrode, and the semiconductor device may have the enhancement mode (E-mode) electrical property accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
   providing at least one mesa structure, wherein the at least one mesa structure comprises a III-V compound semiconductor layer;
   forming a passivation layer on the at least one mesa structure;
   forming a gate dielectric layer on the passivation layer;
   forming a gate electrode on the gate dielectric layer; and
   performing an etching process to the gate dielectric layer for thinning the gate dielectric layer before forming the gate electrode, wherein a thickness of the gate dielectric layer is greater than a thickness of the passivation layer before the etching process, and the thickness of the gate dielectric layer is less than the thickness of the passivation layer after the etching process.

2. The manufacturing method of the semiconductor device according to claim 1, further comprising:
   forming recesses in the at least one mesa structure, wherein at least a part of the gate electrode is formed in the recesses.

3. The manufacturing method of the semiconductor device according to claim 1, wherein the providing the at least one mesa structure comprises providing a plurality of the mesa structures, and the manufacturing method of the semiconductor device further comprises:
   forming an isolation structure between the mesa structures, wherein the passivation layer is further formed on the isolation structure.

4. The manufacturing method of the semiconductor device according to claim 3, further comprising:
   forming a recess in at least one of the mesa structures, wherein at least a part of the gate electrode is formed in recess, and the isolation structure is formed before the step of forming the recess.

5. The manufacturing method of the semiconductor device according to claim 1, further comprising:
   forming a recess in the at least one mesa structure, wherein at least a part of the gate electrode is formed in the recess.

6. The manufacturing method of the semiconductor device according to claim 5, wherein the passivation layer and the gate dielectric layer are formed after the step of forming the recess, and the passivation layer and the gate dielectric layer are partially formed in the recess.

7. The manufacturing method of the semiconductor device according to claim 5, wherein the at least one mesa structure further comprises a nitride layer disposed on the III-V compound semiconductor layer, and the recess is partially formed in the nitride layer.

8. The manufacturing method of the semiconductor device according to claim 7, wherein a part of the recess is further formed in the III-V compound semiconductor layer.

9. The manufacturing method of the semiconductor device according to claim 5, wherein the passivation layer comprises a first passivation layer and a spacer, and methods of forming the passivation layer and the recess comprises:

forming the first passivation layer on the at least one mesa structure;

forming an opening in the first passivation layer and forming the spacer on a sidewall of the opening; and etching the at least one mesa structure with the spacer as a mask for forming the recess.

10. The manufacturing method of the semiconductor device according to claim 9, wherein the passivation layer further comprises a second passivation layer, the second passivation layer is formed after the step of forming the recess, and at least a part of the second passivation layer is formed in the recess.

11. The manufacturing method of the semiconductor device according to claim 5, further comprising:

forming a fluorine doped region in the at least one mesa structure under the recess.

12. The manufacturing method of the semiconductor device according to claim 11, wherein at least a part of the fluorine doped region is located in the III-V compound semiconductor layer.

13. The manufacturing method of the semiconductor device according to claim 1, further comprising:

forming a source electrode and a drain electrode at two sides of the gate electrode in a horizontal direction respectively, wherein the source electrode is partially formed in the at least one mesa structure, and the drain electrode is partially formed in the at least one mesa structure.

14. The manufacturing method of the semiconductor device according to claim 13, wherein the source electrode and the drain electrode penetrate the gate dielectric layer and the passivation layer on the at least one mesa structure.

15. The manufacturing method of the semiconductor device according to claim 13, wherein the at least one mesa structure further comprises a nitride layer disposed on the III-V compound semiconductor layer, and the source electrode and the drain electrode are partially formed in the nitride layer.

16. The manufacturing method of the semiconductor device according to claim 15, wherein the source electrode and the drain electrode are further partially formed in the III-V compound semiconductor layer.

17. The manufacturing method of the semiconductor device according to claim 13, further comprising:

forming an auxiliary electrode on the at least one mesa structure between the gate electrode and the drain electrode.

18. The manufacturing method of the semiconductor device according to claim 17, wherein the auxiliary electrode is electrically floating.

19. The manufacturing method of the semiconductor device according to claim 17, wherein the auxiliary electrode is electrically connected with the source electrode.

* * * * *